(12) United States Patent
Tseng et al.

(10) Patent No.: US 11,923,008 B2
(45) Date of Patent: *Mar. 5, 2024

(54) TERNARY CONTENT ADDRESSABLE MEMORY AND DECISION GENERATION METHOD FOR THE SAME

(71) Applicant: MACRONIX INTERNATIONAL CO., LTD., Hsinchu (TW)

(72) Inventors: Po-Hao Tseng, Taichung (TW); Feng-Min Lee, Hsinchu (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,827

(22) Filed: Jan. 18, 2023

(65) Prior Publication Data

US 2023/0154535 A1    May 18, 2023

Related U.S. Application Data

(63) Continuation of application No. 17/333,046, filed on May 28, 2021, now Pat. No. 11,587,617.

(60) Provisional application No. 63/070,273, filed on Aug. 26, 2020, provisional application No. 63/070,270, filed on Aug. 26, 2020, provisional application No. 63/070,272, filed on Aug. 26, 2020, provisional application No. 63/070,271, filed on Aug. 26, 2020.

(51) Int. Cl.
*G11C 11/404* (2006.01)
*G11C 15/04* (2006.01)
*G11C 16/04* (2006.01)

(52) U.S. Cl.
CPC ............ *G11C 15/04* (2013.01); *G11C 15/046* (2013.01); *G11C 11/404* (2013.01); *G11C 16/0458* (2013.01); *G11C 16/0475* (2013.01); *G11C 2211/4013* (2013.01); *G11C 2211/4016* (2013.01)

(58) Field of Classification Search
CPC ..... G11C 15/04; G11C 15/046; G11C 11/404; G11C 16/0458; G11C 16/0475; G11C 2211/4013; G11C 2211/4016
USPC ...................................................... 365/49.17
See application file for complete search history.

(56) References Cited

U.S. PATENT DOCUMENTS

| | | | |
|---|---|---|---|
| 6,317,349 | B1 | 11/2001 | Wong |
| 7,773,401 | B2 | 8/2010 | Shen |
| 10,741,244 | B1 | 8/2020 | Lee |

(Continued)

*Primary Examiner* — Ly D Pham
(74) *Attorney, Agent, or Firm* — McClure, Qualey & Rodack, LLP

(57) ABSTRACT

A TCAM comprises a plurality of first search lines, a plurality of second search lines, a plurality of memory cell strings and one or more current sensing units. The memory cell strings comprise a plurality of memory cells. The current sensing units are coupled to the memory cell strings. In a search operation, a determination that whether any of the data stored in the memory cell strings matches a data string to be searched is made according to whether the one or more current sensing units detect current from the memory cell strings, or according to the magnitude of the current flowing out from the memory cell strings detected by the one or more current sensing units. Each memory cell includes a first transistor and a second transistor. Gates of the first and second transistors are coupled to a corresponding first search line and a corresponding second search line.

20 Claims, 14 Drawing Sheets

(56) References Cited

U.S. PATENT DOCUMENTS

2014/0198551 A1  7/2014  Louie
2022/0108748 A1  4/2022  Tseng

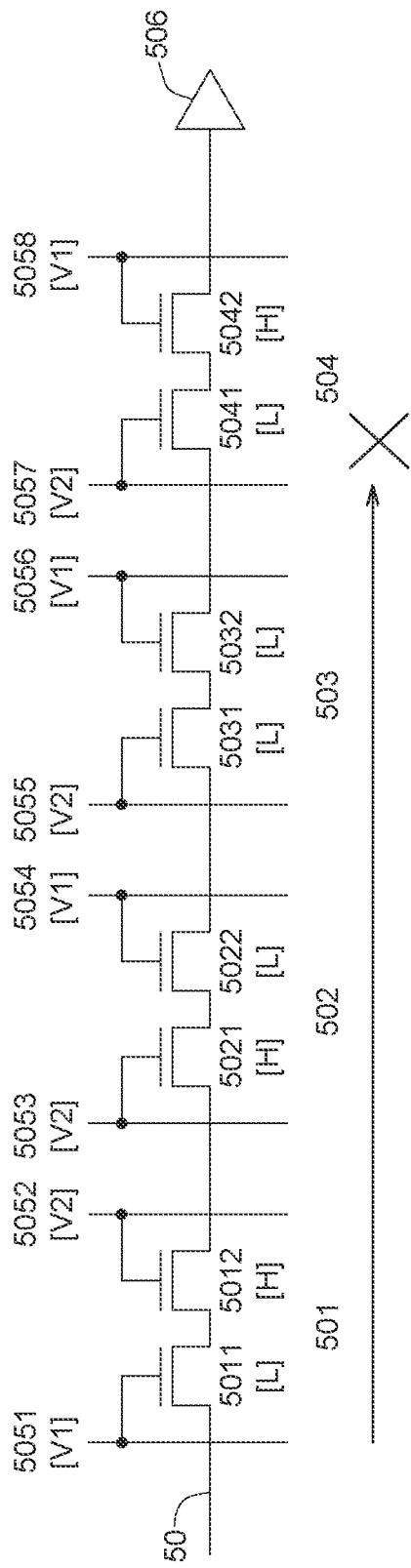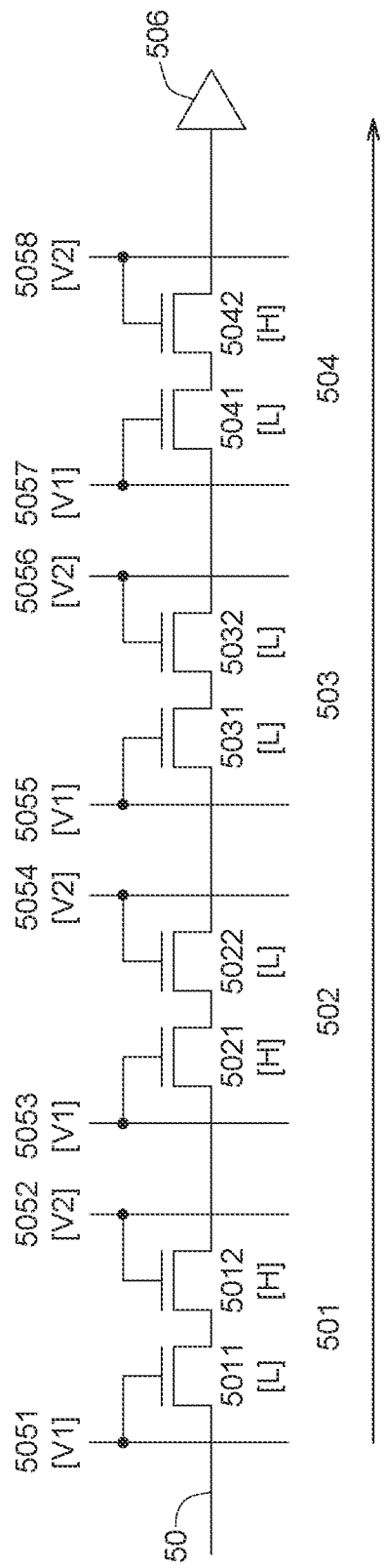

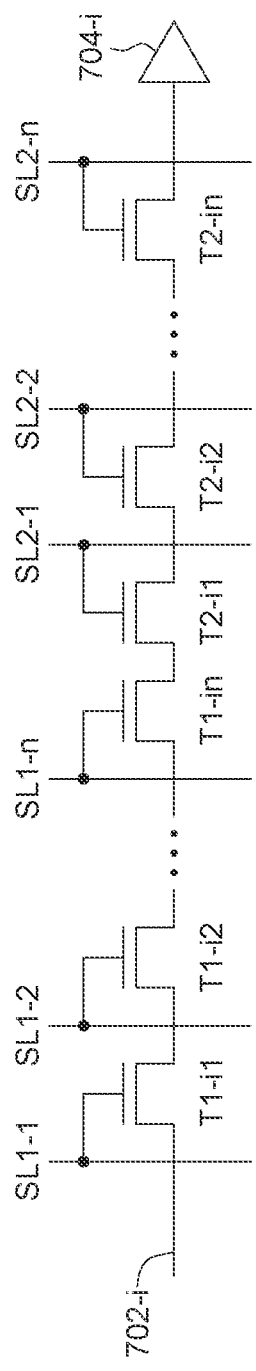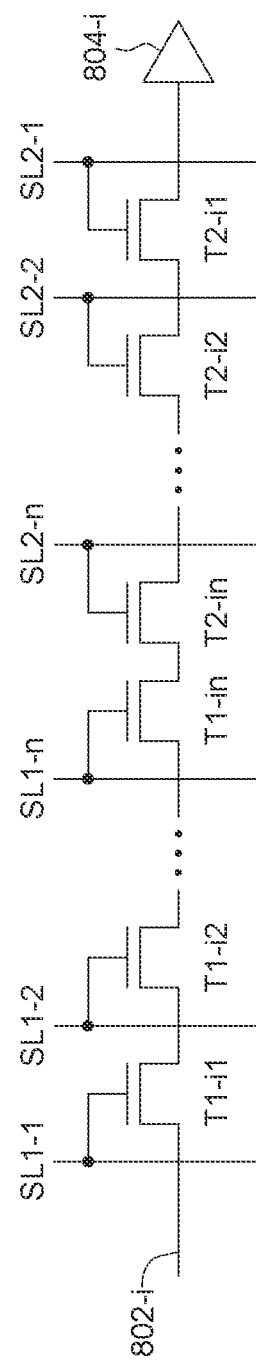
FIG. 8A
FIG. 8B

|  | MSB |  |  |  |  |  |  | LSB |
|---|---|---|---|---|---|---|---|---|
| target data string | 0 | 1 | 1 | 0 | 0 | 0 | 1 | 0 |

|  |  |  |  |  |  |  |  |  |
|---|---|---|---|---|---|---|---|---|
| mask 1 | 0 | 1 | 1 | 0 | 0 | 0 | 1 | × |
| mask 2 | 0 | 1 | 1 | 0 | × | 0 | 1 | 0 |
| mask 3 | 0 | 1 | 1 | × | × | 0 | 1 | × |

FIG. 12

TERNARY CONTENT ADDRESSABLE MEMORY AND DECISION GENERATION METHOD FOR THE SAME

This application is a continuation application of application Ser. No. 17/333,046, filed May 28, 2021, now U.S. Pat. No. 11,587,617, which claims the benefit of US provisional application Ser. No. 63/070,270, filed Aug. 26, 2020, US provisional application Ser. No. 63/070,271, filed Aug. 26, 2020, US provisional application Ser. No. 63/070,272, filed Aug. 26, 2020, and US provisional application Ser. No. 63/070,273, filed Aug. 26, 2020, the subject matters of which are incorporated herein by references.

CROSS REFERENCE TO RELATED PATENT APPLICATION

This is a continuation of application Ser. No. 17/333,046, filed May 28, 2021, the contents of which are incorporated herein by reference.

BACKGROUND OF THE INVENTION

Field of the Invention

The invention relates to ternary content addressable memory.

Description of the Related Art

Since ternary content addressable memory (TCAM) could perform precise matching and fuzzy matching, TCAM is suitable for big data. With the rapid development of big data technology, TCAM has also received attention.

SUMMARY OF THE INVENTION

According to a first aspect of the present invention, a ternary content addressable memory (TCAM) is provided. The TCAM includes a number of first search lines, a number of second search lines, a number of memory cell strings, and one or more current sensing units. Each of the memory cell strings includes a number of memory cells. Each of the memory cells is coupled to one of the first search lines and one of the second search lines. One or more current sensing units are coupled to the memory cell strings. In a search operation, a determination that whether any of the data stored in the memory cell strings matches a data string to be searched is made according to whether the one or more current sensing units detect current from the memory cell strings, or according to the magnitude of the current flowing out from the memory cell strings detected by the one or more current sensing units. The memory cell strings include a particular memory cell string. Each memory cell of the particular memory cell string includes a first transistor and a second transistor. A first terminal of the first transistor is coupled to a corresponding first search line. A first terminal of the second transistor is coupled to a corresponding second search line. The first terminal of the first transistor is a gate of the first transistor, and the first terminal of the second transistor is a gate of the second transistor. When the data stored in the particular memory cell string matches the data string to be searched in the search operation, a particular current flows through the memory cells of the particular memory cell string and a corresponding current sensing unit detects the particular current outputted from the particular memory cell string, or the corresponding current sensing unit detects a magnitude of the particular current.

According to a second aspect of the present invention, a decision generation method for TCAM is provided. The method includes the following steps. A target data string is received. One or more masks are determined, and an input data string is generated according to the one or more masks and the target data string. A number of searching voltages are applied to a number of first search lines and a number of second search lines according to the input data string. One or more decision parameters are generated according to a number of current values sensed by a number of current sensing units. A decision is generated according to the one or more decision parameters. The first search lines and the second search lines are coupled to a number of memory cell strings. The memory cell strings include a particular memory cell string. The particular memory cell string includes a number of memory cells. Each memory cell of the particular memory cell string includes a first transistor and a second transistor. A first terminal of the first transistor is coupled to a corresponding first search line. A first terminal of the second transistor is coupled to a corresponding second search line. The first terminal of the first transistor is a gate of the first transistor, and the first terminal of the second transistor is a gate of the second transistor. When the data stored in the particular memory cell strings matches the data string to be searched in the search operation, a particular current flows through the memory cells of the particular memory cell string and a corresponding current sensing unit detects the particular current outputted from the particular memory cell string, or the corresponding current sensing unit detects a magnitude of the particular current.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIGS. 5A-5C show schematic diagrams of the operation of a memory cell string according to another embodiment of the present invention.

FIGS. 8A-8C show block diagrams of a memory cell string according to yet another embodiments of the present invention.

FIG. 12 shows a schematic diagram of target data strings and masks.

DETAILED DESCRIPTION OF THE INVENTION

Figure 1:
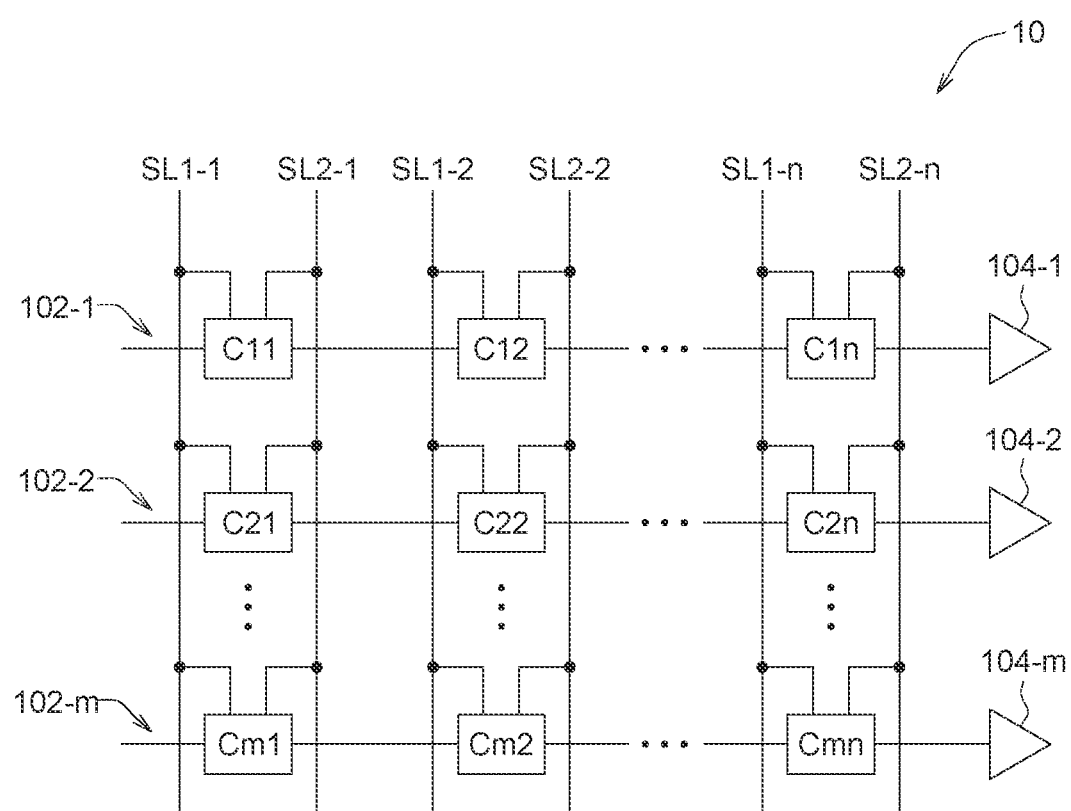
FIG. 1 shows a block diagram of a TCAM according to an embodiment of the present invention.

Referring to FIG. 1, FIG. 1 shows a block diagram of a ternary Content addressable memory, hereafter, TCAM, according to an embodiment of the present invention. TCAM 10 includes a number of memory cell strings 102-1~102-$m$, a number of current sensing units 104-1~104-$m$, a number of first search lines SL1-1~SL1-$n$ and a number of second search lines SL2-1~SL2-$n$, wherein m, n are positive integers.

The memory cell string 102-$i$ is coupled to the current sensing unit 104-$i$, and includes a number of memory cells Ci1~Cin, the memory cell Cij is coupled to the first search line SL1-$j$ and the second search line SL2-$j$, wherein i is a positive integer and i=1~m, and j is a positive integer and j=1~n.

Figure 2:
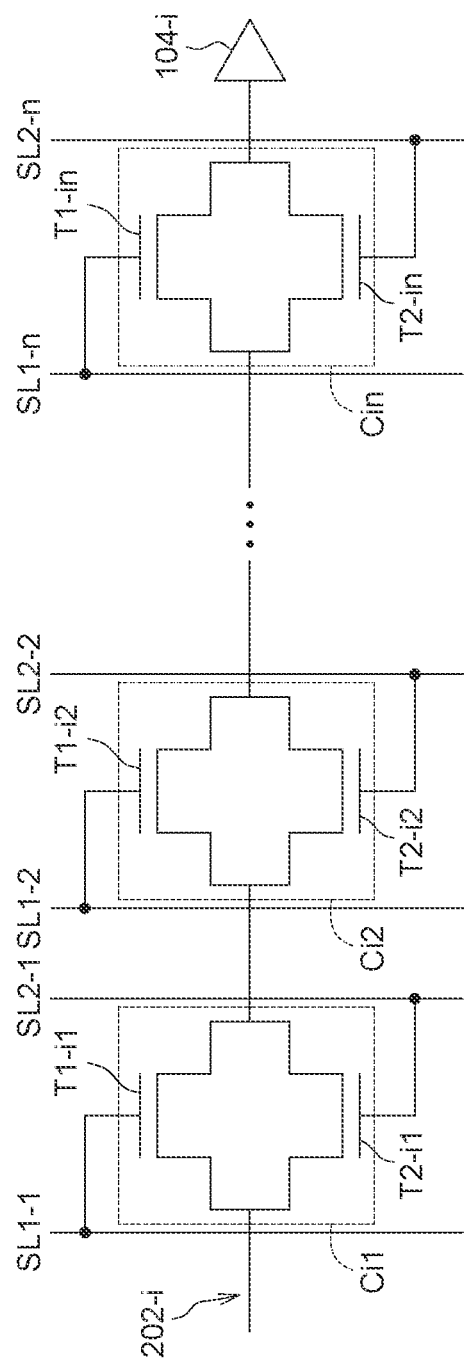
FIG. 2 shows a block diagram of a memory cell string according to an embodiment of the present invention.

Referring to FIG. 2, FIG. 2 is a block diagram of a memory cell string according to an embodiment of the present invention. FIG. 2 shows a memory cell string 202-$i$ for implementing the memory cell string 102-$i$, including the detail of the memory cells Ci1~Cin. The memory cell Cij includes a first transistor T1-$ij$ and a second transistor T2-$ij$. A first terminal (e.g., gate) of the first transistor T1-$ij$ is coupled to the first search line SL1-$j$. A second terminal (e.g., source) of the first transistor T1-$ij$ is coupled to a second terminal (e.g., source) of the second transistor T2-$ij$. A third terminal (e.g., drain) of the first transistor T1-$ij$ is coupled to a third terminal (e.g., drain) of the second transistor T2-$ij$. A first terminal (e.g., gate) of the second transistor T2-$ij$ is coupled to the second search line SL2-$j$.

The unit cell operations of the memory cell Cij of the embodiment shown in FIG. 2 may include erase operation, programming operation and search operation. The details may be described below.

Regarding to an erase operation, an erase voltage may be applied to the first search line SL1-$j$ and the second search line SL2-$j$. Generally, the erase voltage could be a negative bias voltage so that the charge stored in the first transistor T1-$ij$ and the second transistor T2-$ij$ could be released.

Regarding to a programming operation, by applying suitable programming voltages on the first search line SL1-$j$ and the second search line SL2-$j$ respectively, to program the threshold voltages of the first transistor T1-$ij$ and the second transistor T2-$ij$. While the threshold voltage of the first transistor T1-$ij$ is programmed to a low threshold voltage, and the threshold voltage of the second transistor T2-$ij$ is programmed to a high threshold voltage, the data stored in the memory cell Cij is defined as a first value (e.g., "0"); while the threshold voltage of the first transistor T1-$ij$ is programmed to the high threshold voltage, and the threshold voltage of the second transistor T2-$ij$ is programmed to the low threshold voltage, the data stored in the memory cell Cij is defined as a second value (e.g., "1"). In addition to storing the first value and the second value, the memory cell Cij could optionally support storing "don't care". While the threshold voltage of the first transistor T1-$ij$ is programmed to the low threshold voltage, and the threshold voltage of the second transistor T2-$ij$ is programmed to the low threshold voltage, the data stored in the memory cell Cij is defined as "don't care".

Regarding to a search operation, when searching the first value, the first search line SL1-$j$ may be applied a first searching voltage, the second search line SL2-$j$ may be applied a second searching voltage; when searching the second value, the first search line SL1-$j$ may be applied the second searching voltage, the second search line SL2-$j$ may be applied the first searching voltage. The second searching voltage is greater than the high threshold voltage, the high threshold voltage is greater than the first searching voltage, and the first searching voltage is greater than the low threshold voltage. In addition to searching for the first value and the second value, a "wild card" could be allowable for searching. The "wild card" refers to the data to be searched could be the first value or the second value. That is, when the "wild card" is searched, it is considered as "match" whether the memory cell stores the first value or the second value. When the "wild card" is searched, the first search line SL1-$j$ may be applied the second searching voltage, and the second search line SL2-$j$ may be applied the second searching voltage.

Figure 9:
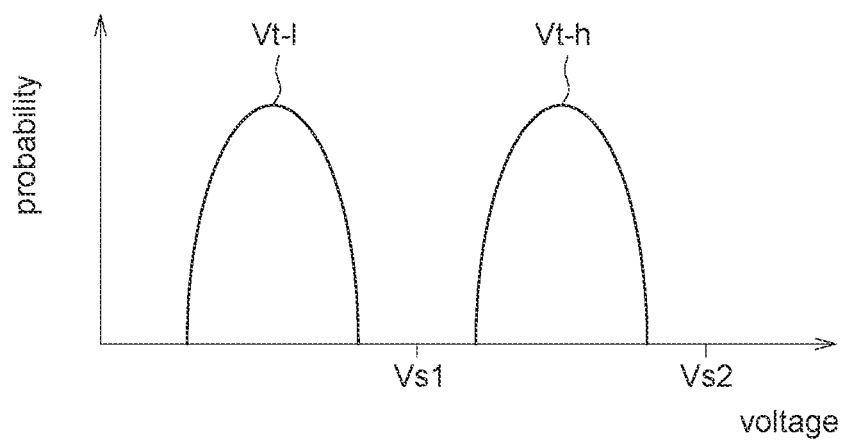
FIG. 9 shows a schematic diagram of the threshold voltages and the searching voltages.

The low threshold voltage, the high threshold voltage, the first searching voltage and the second searching voltage could be understood by referring to a schematic diagram of a distribution of threshold voltages shown in FIG. 9. The horizontal axis represents voltage, the vertical axis represents probability, Vt-l represents a distribution of the low threshold voltage, Vt-h represents a distribution of the high threshold voltage, Vs1 is the first searching voltage, and Vs2 is the second searching voltage.

Figure 3A:
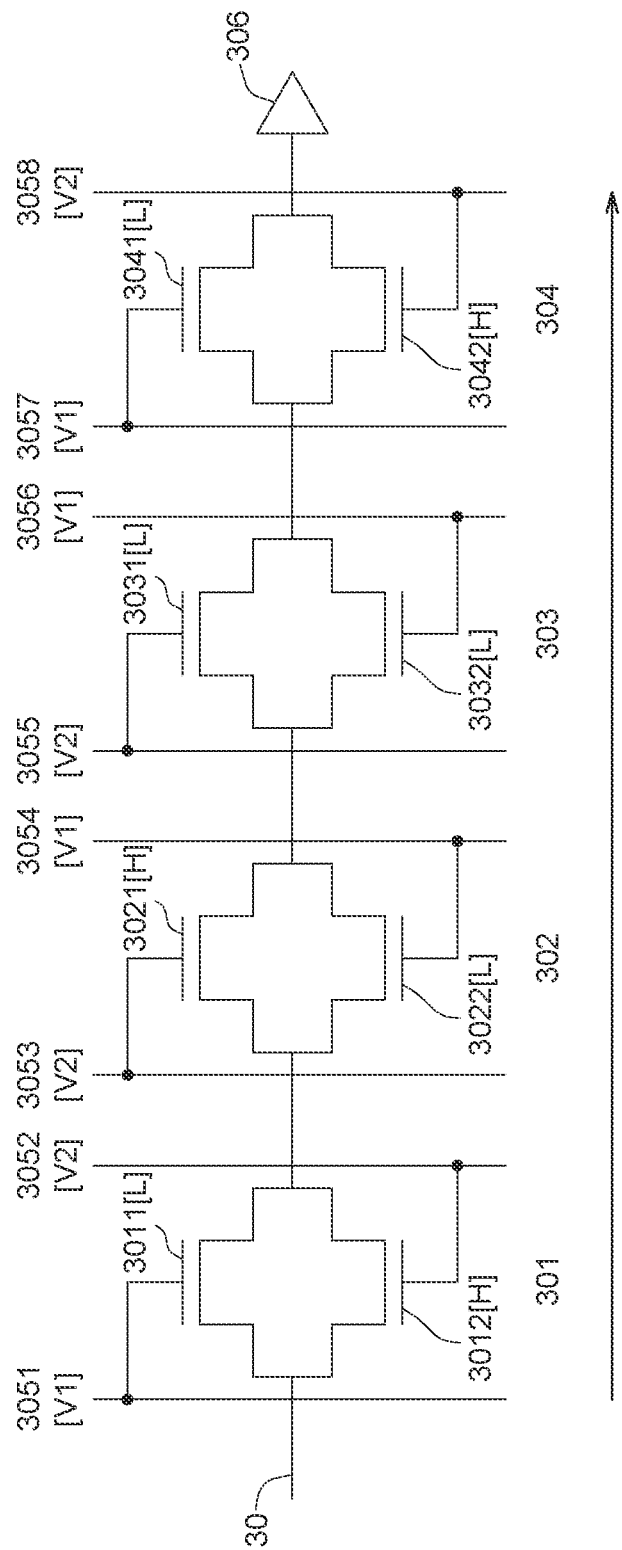
FIGS. 3A-3C show schematic diagrams of the operation of a memory cell string according to an embodiment of the present invention.
Figure 3B:
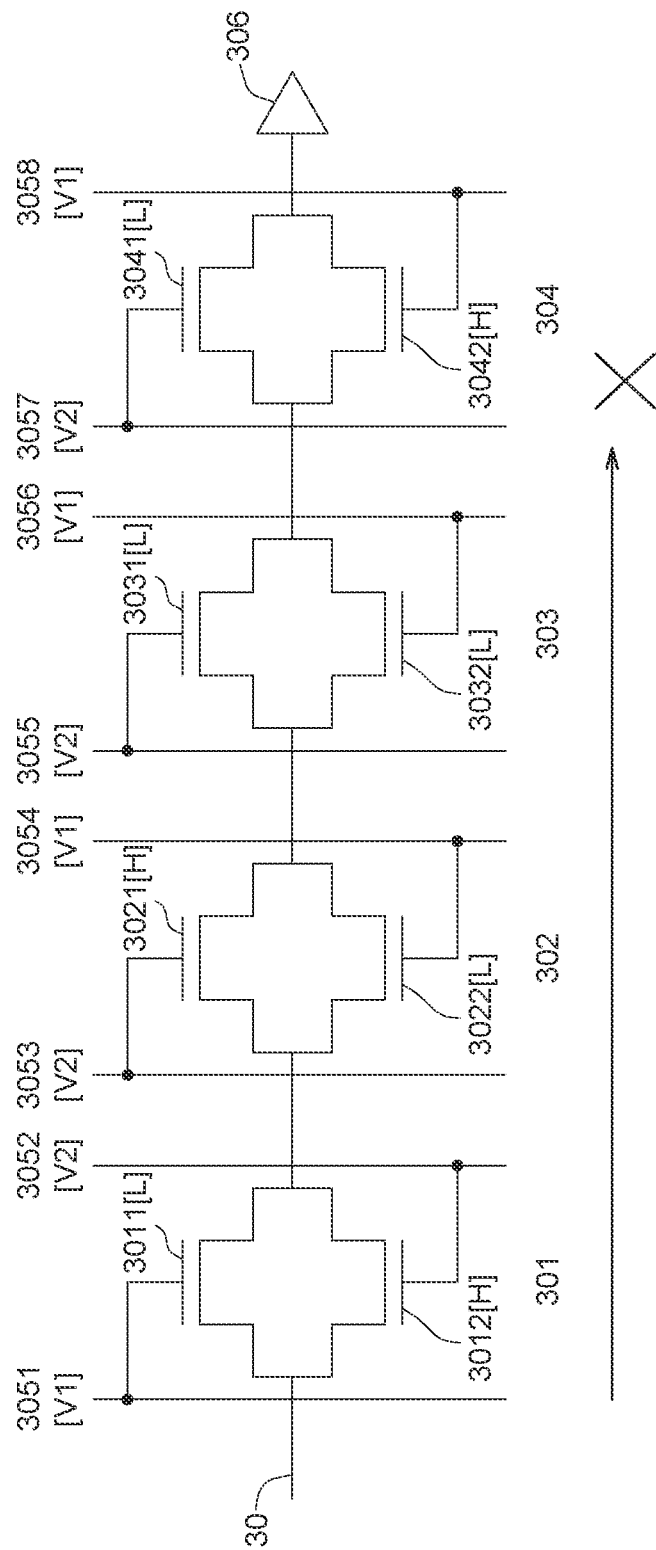
Figure 3C:
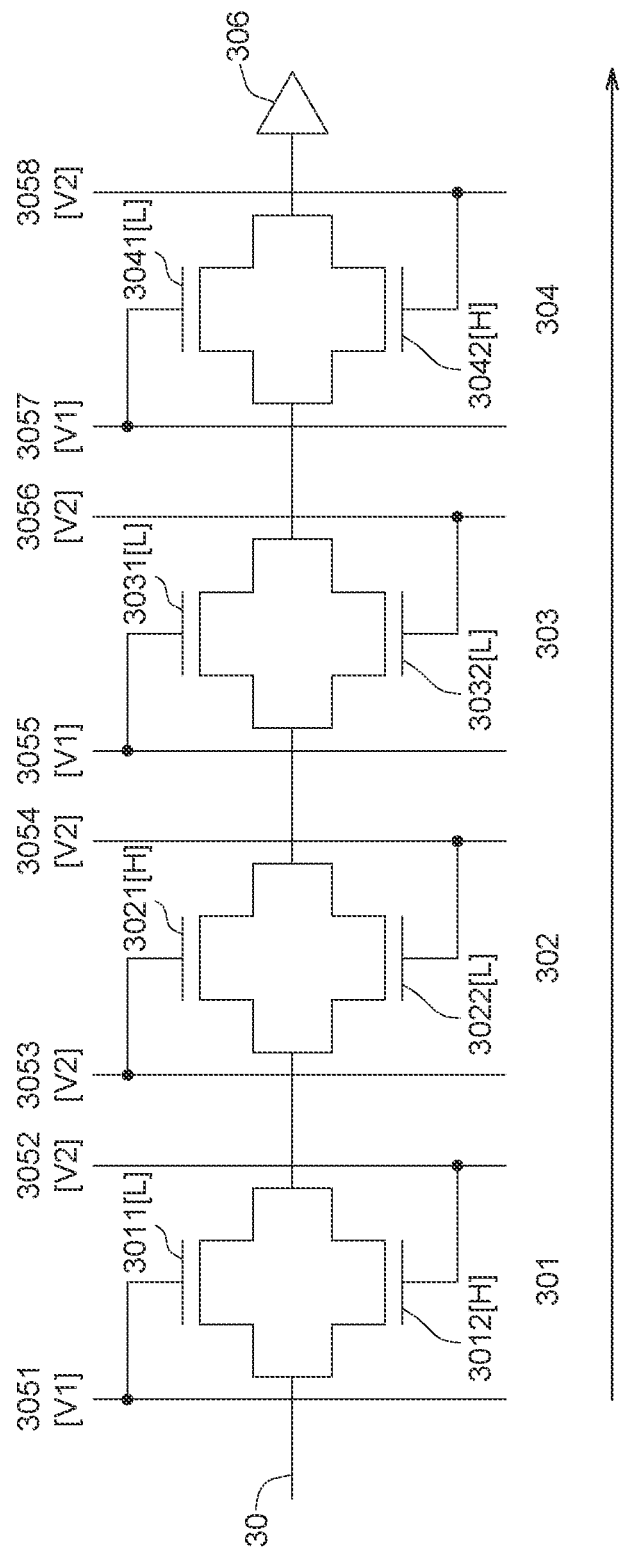

For further understanding of the search operation, the following illustration may be illustrated by employing examples with FIGS. 3A~3C. In FIG. 3A, the memory cell string 30 includes four memory cells 301~304. The first transistor 3011 and the second transistor 3012 of the memory cell 301 are programmed to the low threshold voltage (represented by [L]) and the high threshold voltage (represented by [H]) respectively. That is, the memory cell 301 stores "0". By analogy, the memory cells 302~304 store "1", "X", "0", respectively, wherein "X" represents "don't care". The data string to be searched in this example is "0110". When the search operation is performed, the second terminal of the first transistor 3011 and the second terminal of the second transistor 3012 may be applied with suitable bias voltages, the first search lines 3051, 3053, 3055, 3057 may be applied with the first searching voltage (represented by [V1]), the second searching voltage (represented by [V2]), the second searching voltage and the first searching voltage respectively, and the second search lines 3052, 3054, 3056, 3058 may be applied with the second searching voltage, the first searching voltage, the first searching voltage and the second searching voltage respectively. The transistors of the memory cells 301, 302, 304 are turned on. For the memory cell 303, since the threshold voltages of the first transistor 3031 and the second transistor 3032 are the low threshold voltage, the first transistor 3031 and the second transistor 3032 could be turned on no matter the gate voltages of the first transistor 3031 and the second transistor 3032 are the first searching voltage or the second searching voltage. Therefore, current may flow from the second terminal of the first transistor 3011 and the second terminal of the second transistor 3012 to the third terminal of the first transistor 3041 and the third terminal of the second transistor 3042. By detecting whether there is current flowing from the memory cell string 30 (the third terminal of the first transistor 3041 and the third terminal of the second transistor 3042), or detecting the magnitude of the current flowing from the memory cell string 30 (the third terminal of the first transistor 3041 and the third terminal of the second transistor 3042), by the current sensing unit 306, it could be determined whether the data string stored in the memory cell string 30 matches the data string to be searched. In this example, the current sensing unit 306 detects current flowing from the memory cell string 30 so that a determination that the data stored in the memory cell string matches the data to be search could be made.

Referring to the example shown in FIG. 3B, FIG. 3B is similar to FIG. 3A. The memory cell string 30 also stores "01X0". The difference is that the data string to be searched is "0111". The transistors of the memory cells 301~303 are turned on. However, due to the mismatch between the data stored in the memory cell 304 and the data to be searched so that the first transistor 3041 and the second transistor 3042 are turned off and current could not pass through. Therefore, the current sensing unit 306 could not detect current flowing from the memory cell string 30 so that a determination that the data string stored in the memory cell string 30 does not match the data string could be made.

Referring to the example shown in FIG. 3C, FIG. 3C is similar to FIG. 3A. The memory cell string 30 also stores "01X0". The difference is the data string to be searched is "0?00". "?" represents the "wild card", that is, the bit could be "0" or "1". The transistors of the memory cells 301, 303, 304 are turned on. For the memory cell 302, since the gate voltages of the first transistor 3021 and the second transistor 3022 are the second searching voltage which is higher than the high threshold voltage and the low threshold voltage, the first transistor 3021 and the second transistor 3022 may be turned on no matter the data stored in the memory cell 302 is "0" or "1". The current sensing unit 306 detects current flowing from the memory cell string 30 so that a determination that the data string stored in the memory cell string 30 matches the data string to be searched could be made.

Figure 4:
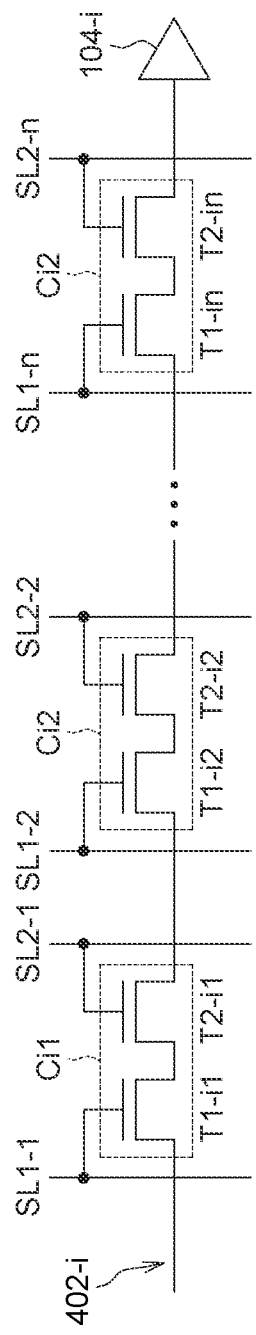
FIG. 4 shows a block diagram of another memory cell string according to an embodiment of the present invention.

Referring to FIG. 4, FIG. 4 shows a block diagram of a memory cell string according to another embodiment of present invention. FIG. 4 shows a memory cell string 402-$i$ for implementing the memory cell string 102-$i$, including the detail of the memory cells Ci1~Cin. The memory cell Cij includes a first transistor T1-$ij$ and a second transistor T2-$ij$. A first terminal (e.g., gate) of the first transistor T1-$ij$ is coupled to the first search line SL1-$j$. A third terminal (e.g., drain) of the first transistor T1-$ij$ is coupled to a second terminal (e.g., source) of the second transistor T2-$ij$. A first terminal (e.g., gate) of the second transistor T1-$ij$ is coupled to the second search line SL2-$j$.

The unit cell operations of the memory cell Cij of the embodiment shown in FIG. 4 may include erase operation, programming operation and search operation. The details may be described below.

Regarding to an erase operation, an erase voltage may be applied to the first search line SL1-$j$ and the second search line SL2-$j$. Generally, the erase voltage could be a negative bias voltage so that the charge stored in the first transistor T1-$ij$ and the second transistor T2-$ij$ could be released.

Regarding to a programming operation, by applying suitable programming voltages on the first search line SL1-$j$ and the second search line SL2-$j$ respectively, to program the threshold voltages of the first transistor T1-$ij$ and the second transistor T2-$ij$. While the threshold voltage of the first transistor T1-$ij$ is programmed to a low threshold voltage, and the threshold voltage of the second transistor T2-$ij$ is programmed to a high threshold voltage, the data stored in the memory cell Cij is defined as a first value (e.g., "0"); while the threshold voltage of the first transistor T1-$ij$ is programmed to the high threshold voltage, and the threshold voltage of the second transistor T2-$ij$ is programmed to the low threshold voltage, the data stored in the memory cell Cij is defined as a second value (e.g., "1"). In addition to storing the first value and the second value, the memory cell Cij could optionally support storing "don't care". While the threshold voltage of the first transistor T1-$ij$ is programmed to the low threshold voltage, and the threshold voltage of the second transistor T2-$ij$ is programmed to the low threshold voltage, the data stored in the memory cell Cij is defined as "don't care".

Regarding to a search operation, when searching the first value, the first search line SL1-$j$ may be applied a first searching voltage, the second search line SL2-$j$ may be applied a second searching voltage; when searching the second value, the first search line SL1-$j$ may be applied the second searching voltage, the second search line SL2-$j$ may be applied the first searching voltage. The second searching voltage is greater than the high threshold voltage, the high threshold voltage is greater than the first searching voltage, and the first searching voltage is greater than the low threshold voltage. In addition to searching for the first value and the second value, a "wild card" could be allowable for searching. The "wild card" refers to the data to be searched could be the first value or the second value. That is, when the "wild card" is searched, it is considered as "match" whether the memory cell stores the first value or the second value. When the "wild card" is searched, the first search line SL1-$j$ may be applied with the second searching voltage, and the second search line SL2-$j$ may be applied with the second searching voltage.

Figure 5A:
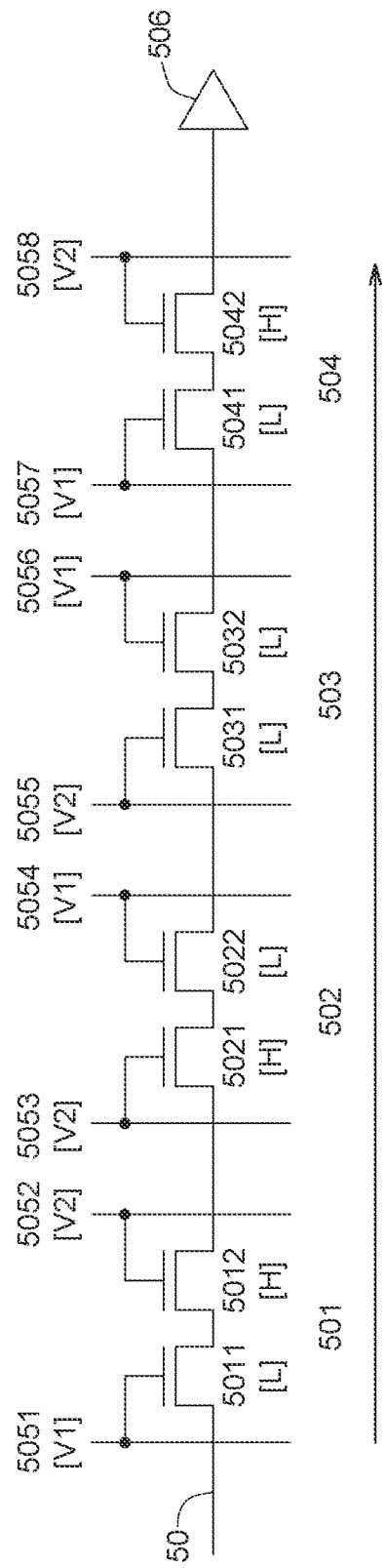

For further understanding of the search operation, the following illustration may be illustrated by employing examples with FIGS. 5A~5C. In FIG. 5A, the memory cell string 50 includes four memory cells 501~504. The first transistor 5011 and the second transistor 5012 of the memory cell 501 are programmed to the low threshold voltage (represented by [L]) and the high threshold voltage (represented by [H]) respectively. That is, the memory cell 501 stores "0". By analogy, the memory cells 502~504 store "1", "X", "0", respectively, wherein "X" represents "don't care". The data string to be searched in this example is "0110". When the search operation is performed, the second terminal of the first transistor 5011 may be applied a suitable bias voltage, the first search lines 5051, 5053, 5055, 5057 may be applied the first searching voltage (represented by [V1]), the second searching voltage (represented by [V2]), the second searching voltage and the first searching voltage respectively, and the second search lines 5052, 5054, 5056, 5058 may be applied the second searching voltage, the first searching voltage, the first searching voltage and the second searching voltage respectively. The transistors of the memory cells 501, 502, 504 are turned on. For the memory cell 503, since the threshold voltages of the first transistor 5031 and the second transistor 5032 are the low threshold voltage, the first transistor 5031 and the second transistor 5032 could be turned on whether the gate voltages of the first transistor 5031 and the second transistor 5032 are the first searching voltage or the second searching voltage. Therefore, current may flow from the second terminal of the first transistor 5011 to the third terminal of the second transistor 5042. By detecting whether there is current flowing from the memory cell string 50 (the third terminal of the second transistor 5042), or detecting the magnitude of the current flowing from the memory cell string 50 (the third terminal of the second transistor 5042), by the current sensing unit 506, it could be determined whether the data string stored in the memory cell string 50 matches the data string to be searched. In this example, the current sensing unit 506 detects current flowing from the memory cell string 50 so that a determination that the data stored in the memory cell string matches the data to be search could be made.

Referring to the example shown in FIG. 5B, FIG. 3B is similar to FIG. 5A. The memory cell string 50 also stores "01X0". The difference is that the data string to be searched is "0111". The transistors of the memory cells 501~503 are turned on so that current could flow through. However, due to the mismatch between the data stored in the memory cell 504 and the data to be searched so that the first transistor 5041 and the second transistor 5042 are turned off and current could not pass through. Therefore, the current sensing unit 506 could not detect current flowing from the memory cell string 30 so that a determination that the data string stored in the memory cell string 50 does not match the data string could be made.

Referring to the example shown in FIG. 5C, FIG. 5C is similar to FIG. 5A. The memory cell string 50 also stores "01X0". The difference is the data string to be searched is "0?00". "?" represents the "wild card", that is, the bit could be "0" or "1". The transistors of the memory cells 501, 503, 504 are turned on so that current could flow through. For the memory cell 502, since the gate voltages of the first transistor 5021 and the second transistor 5022 are the second searching voltage which is higher than the high threshold voltage and the low threshold voltage, the first transistor 5021 and the second transistor 5022 may be turned on whether the data stored in the memory cell 502 is "0" or "1". The current sensing unit 506 detects current flowing from the memory cell string 50 so that a determination that the data string stored in the memory cell string 50 matches the data string to be searched could be made.

Different applications such as artificial intelligence, big data search may require different quantization level, and the use of wild cards during search could provide flexibility in various applications. The operations of FIGS. 5A to 5C could be extended to data formats with longer data length, such as TF32, TF16, FP64, FP32, FP16, INT16, INT8, based on the principle described above.

Figure 5D:
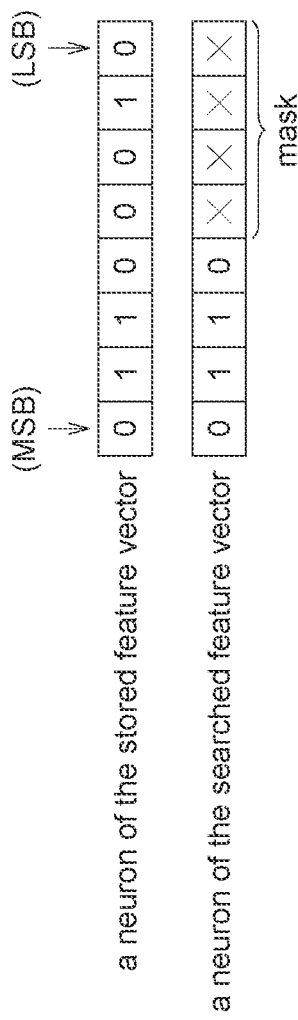
FIG. 5D shows a schematic diagram of a stored data string and a searched data string.

Referring to FIG. 5D, FIG. 5D shows a schematic diagram of a stored data string and a searched data string. In this example, the data string (for example, a neuron of a feature vector) stored in a memory cell string is "01100010". The fifth bit of the searched data string is configured as the starting position for quantization so that the last four bits are masked with wild cards during search.

During artificial intelligence inference operations, a feature vector may include a number of neurons, and each neuron represents a single binary data string in a format such as FP16 or INT8. If wild cards are not used for masking when searching, the slight difference between the input feature vector for searching and the stored feature vectors may result in no search result. This problem is usually caused by the difference in some of the least significant bits (LSB) of each neuron. As a practical example, if a memory cell string includes 96 transistors, then the memory cell string could store 48 bits of binary data. If the stored data format is INT8, the feature vector stored in the memory cell string could include 6 neurons representing in INT8 format. When wild cards for masking are not used in searching, the forty-eight-bit feature vector stored in any memory cell string must all match the input forty-eight-bit feature vector during the search to have a matching search result. This is impractical in real application. In order to solve the above problem, the last four bits of each neuron in the feature vector input during the search would be masked with wild cards (for example, as shown in FIG. 5D). In practical applications, the starting position and length of the mask may be configured according to the quantization level to achieve different search resolutions.

Figure 6:
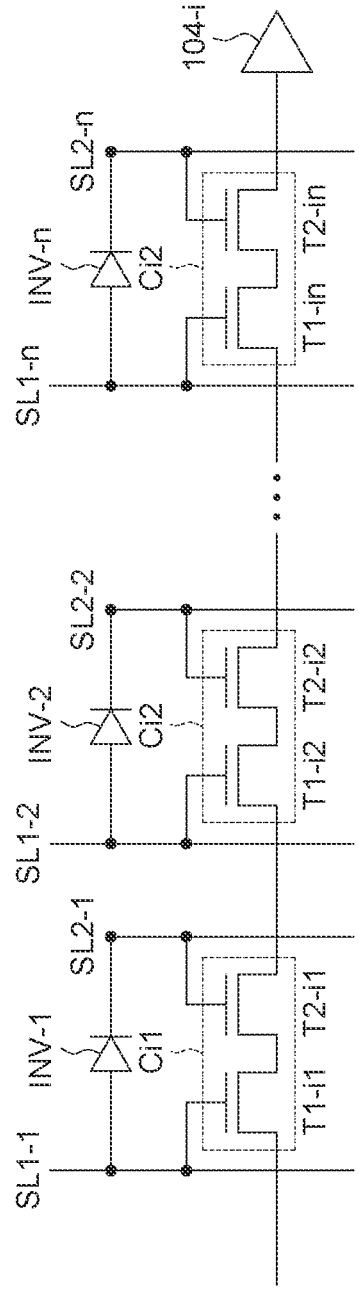
FIG. 6 shows a block diagram of yet another memory cell string according to an embodiment of the present invention.

Referring to FIG. 6, FIG. 6 shows a modified embodiment of FIG. 4. In this embodiment, the first search line SL1-$j$ is coupled to the second search line SL2-$j$ by an inverter INV-$j$.

The unit cell operations of the memory cell Cij of the embodiment shown in FIG. 4 may include erase operation, programming operation and search operation. The details may be described below.

Regarding to an erase operation, an erase voltage may be applied to the first search line SL1-$j$. Generally, the erase voltage could be a negative bias voltage so that the charge stored in the first transistor T1-$ij$ and the second transistor T2-$ij$ could be released.

Regarding to a programming operation, by applying suitable programming voltages on the first search line SL1-$j$, to program the threshold voltages of the first transistor T1-$ij$ and the second transistor T2-$ij$ respectively. While the threshold voltage of the first transistor T1-$ij$ is programmed to a low threshold voltage, and the threshold voltage of the second transistor T2-$ij$ is programmed to a high threshold voltage, the data stored in the memory cell Cij is defined as a first value (e.g., "0"); while the threshold voltage of the first transistor T1-$ij$ is programmed to the high threshold voltage, and the threshold voltage of the second transistor T2-$ij$ is programmed to the low threshold voltage, the data stored in the memory cell Cij is defined as a second value (e.g., "1"). In addition to storing the first value and the second value, the memory cell Cij could optionally support storing "don't care". While the threshold voltage of the first transistor T1-$ij$ is programmed to the low threshold voltage, and the threshold voltage of the second transistor T2-$ij$ is programmed to the low threshold voltage, the data stored in the memory cell Cij is defined as "don't care".

Regarding to a search operation, when searching the first value, the first search line SL1-$j$ may be applied a first searching voltage, and a second searching voltage may be generated on the second search line SL2-$j$ by the inverter INV-j; when searching the second value, the first search line SL1-$j$ may be applied the second searching voltage, and the first searching voltage may be generated on the second search line SL2-$j$ by the inverter INV-j. The second searching voltage is greater than the high threshold voltage, the high threshold voltage is greater than the first searching voltage, and the first searching voltage is greater than the low threshold voltage.

Figure 7:
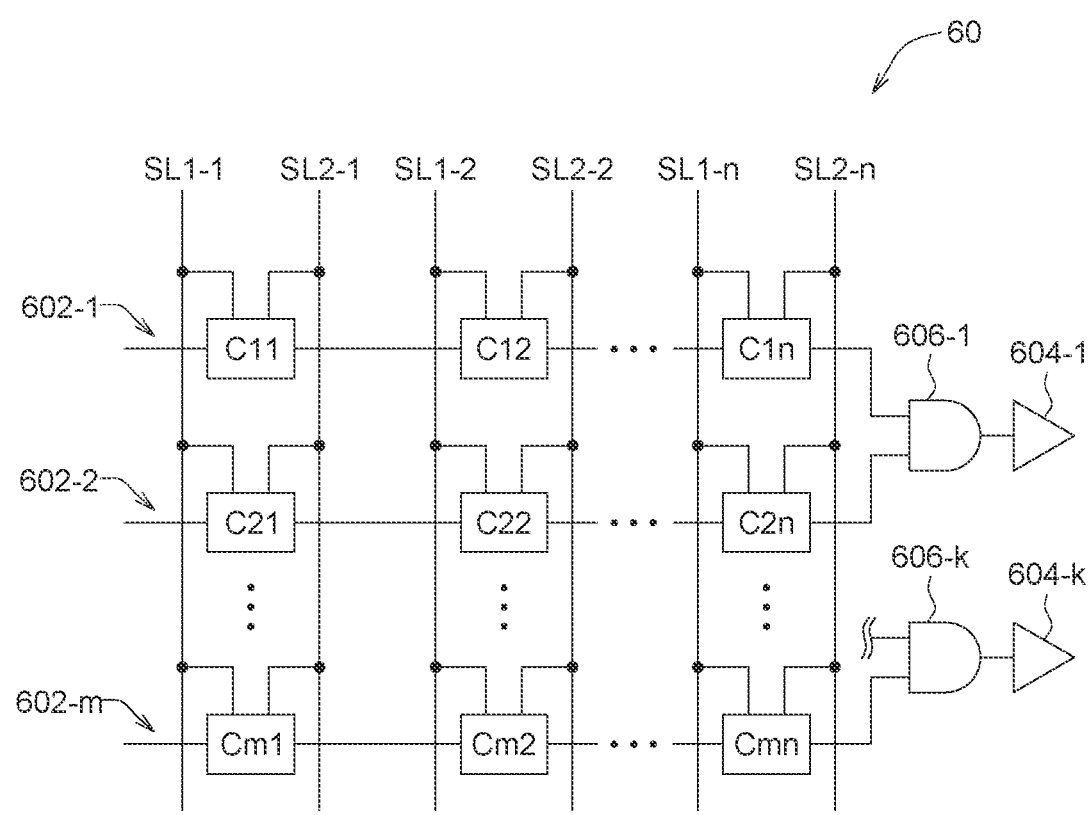
FIG. 7 shows a block diagram of another TCAM according to an embodiment of the present invention.

Referring to FIG. 7, FIG. 7 shows a block diagram of a TCAM according to another embodiment of the present invention. The TCAM 60 is similar to the TCAM 10, the difference is that, in the TCAM 60, the memory cell strings are arranged as a number of groups, the memory cell strings of each group are coupled to a current sensing unit through a AND gate. For example, the memory cell strings 602-1, 602-2 of the first group are coupled to the current sensing unit 605-1 through the AND gate 606-1. When the search operation is performed, if the current sensing unit 605-1 detects that the current flowing from the AND gate 606-1 is not lower than a threshold value (e.g., double the current output when the data string stored in a single memory cell string matches the data string to be searched), a determination that the data string stored in the memory cell strings of the first group matches the data to be search is made, otherwise, a determination of mismatching is made, and so on. In this way, RC delay could be reduced and read/search speed could be increased. In practice, the number of memory cell strings to be arranged to a group of memory cell strings (for example, two or more) could be determined according to the RC delay requirement.

Figure 8C:
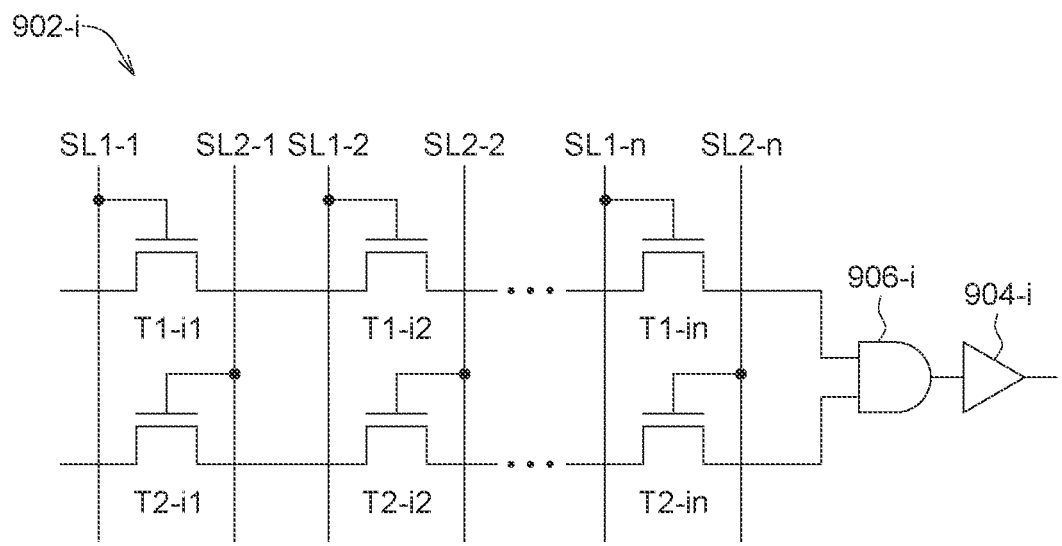

Referring to FIGS. 8A-8C, FIGS. 8A-8C show block diagrams of a memory cell string according to yet another embodiments of present invention. Since the connection of the transistors in the memory cell string in FIG. 4 is serial connection, the same effect could be achieved by arbitrarily changing the order of the transistors. The memory cell string in FIG. 8A shows a modification of the memory cell string in FIG. 4. In the embodiment of FIG. 8, the first transistors T1-$i$1~T1-$in$ of the memory cell string 702-$i$ are arranged to be connected together, and the second transistors T2-$i$1~T2-$in$ are arranged to be connected together, and then the string of the first transistors T1-$i$1~T1-$in$ and the string of the second transistor T2-$i$1~T2-$in$ are connected serially. FIGS. 8A-8C are merely examples. FIG. 8B shows another modification of the embodiment in FIG. 4. The memory cell string 802-$i$ is similar to the memory cell string 702-$i$, the difference lies in the connection sequence of the second transistor T2-$i$1~T2-$in$. FIG. 8C shows yet another modification of the embodiment in FIG. 4. The embodiment in FIG. 8C combines the concepts of the embodiments in FIGS. 7 and 8A. The first transistors T1-$i$1~T1-$in$ are connected in series as a transistor string, and the second transistors T2-$i$1~T2-$in$ are connected in series as another transistor string. The two transistor strings are coupled to a AND gate 806-$i$ so that the two transistor strings are equivalent to series connection. In practice, the serial connection sequence of the transistors could be modified according to actual needs. In addition, the transistors of each memory cell string could be arbitrarily arranged as multiple (e.g., three, four or more) transistor strings and then connected to one or more AND gates to make these transistor strings equivalent to a series connection, thereby reducing RC delay.

Based on the big data technology, the amount of computation is intensive and huge, and the TCAM needs to be read repeatedly for a long time. Therefore, read disturb has become a problem that TCAM needs to face when it is applied to big data.

In order to solve read disturb, the memory cells in a memory cell string could be arranged as a number of set. Each set may include a number of memory cells. In an embodiment, the number of memory cells included in each set could be the same. The programming operation and the search operation are performed in units of a set of memory cells. Taking the memory cell string 402-$i$ in FIG. 4 as an example, the memory cells Ci1, Ci2 are arranged as a first set, and the memory cells Ci3, Ci4 are arranged as a second set, and so on. Although the following embodiment is based on the memory cell string 402-$i$ in FIG. 4, the programming operation and search operation used are different from the previous embodiment. In order to understand this embodiment more clearly, the following describes the programming operation and the search operation of the memory cells of the first set. The erasing operation is similar to that described above, so it may not be repeated.

In table 1, from left, the first column is the data stored in the memory cells Ci1, Ci2 of the first set, the second column is the programmed threshold voltage of the first transistors T1-$i$1, T1-$i$2 and the second transistors T2-$i$1, T2-$i$2, and the third column is the voltage applied to the first search lines SL1-1, SL1-2 and the second search lines SL2-1, SL2-2 while the search operation is performed. In this example, "0" represents the first value, "1" represents the second value, "L" represents the low threshold voltage, "H" represents the high threshold voltage, "V1" represents the first searching voltage, and "V2" represents the second searching voltage.

TABLE 1

| S1[Ci1,Ci2] | [T1-i1,T2-i1,T1-i2,T2-i2] | [SL1-1,SL2-1,SL1-2,SL2-2] |
| --- | --- | --- |
| [0,0] | [H,H,H,L] | [V2,V2,V2,V1] |
| [0,1] | [H,H,L,H] | [V2,V2,V1,V2] |
| [1,0] | [H,L,H,H] | [V2,V1,V2,V2] |
| [1,1] | [L,H,H,H] | [V1,V2,V2,V2] |

In the programming operation, one of the high threshold voltage and the low threshold voltage may be defined as a primary state, and the other one may be defined as a secondary state. In the case without programming data of "don't care", only one transistor among the four transistors of each set of memory cells may be programmed to the secondary state, the other transistors may be programmed to the primary state. In the embodiment of Table 1, the primary state is the high threshold voltage, and the secondary state is the low threshold voltage. The transistor which is programmed to the high threshold voltage would be turned on while the gate of the transistor is applied with the second searching voltage. Therefore, the corresponding combination of the searching voltage in search operation could be determined.

Table 2 is an embodiment different from the embodiment of Table 1.

TABLE 2

| S1[Ci1,Ci2] | [T1-i1,T2-i1,T1-i2,T2-i2] | [SL1-1,SL2-1,SL1-2,SL2-2] |
| --- | --- | --- |
| [0,0] | [H,L,L,L] | [V2,V1,V1,V1] |
| [0,1] | [L,H,L,L] | [V1,V2,V1,V1] |
| [1,0] | [L,L,H,L] | [V1,V1,V2,V1] |
| [1,1] | [L,L,L,H] | [V1,V1,V1,V2] |

In the embodiment of Table 2, the primary state is the low threshold voltage, and the secondary state is the high threshold voltage. In addition, Table 2 also shows that for the same data, the position of the primary state in different encoding could be changed.

In another embodiment, data encoding may support "don't care" in programming, or support "wild card" in searching.

The embodiment of Table 3 is an extension of Table 1. The embodiment of Table 3 supports "don't care" in programming, wherein "X" represents "don't care".

TABLE 3

| S1[Ci1,Ci2] | [T1-i1,T2-i1,T1-i2,T2-i2] | [SL1-1,SL2-1,SL1-2,SL2-2] |
| --- | --- | --- |
| [0,0] | [H,H,H,L] | [V2,V2,V2,V1] |
| [0,1] | [H,H,L,H] | [V2,V2,V1,V2] |
| [1,0] | [H,L,H,H] | [V2,V1,V2,V2] |
| [1,1] | [L,H,H,H] | [V1,V2,V2,V2] |
| [0,X] | [H,H,L,L] | |
| [X,0] | [H,L,H,L] | |
| [1,X] | [L,L,H,H] | |
| [X,1] | [L,H,L,H] | |
| [X,X] | [L,L,L,L] | |

A brief description of the operating principle of "don't care" is provided herein. "Don't care" represents that no matter it is searching for "1" or "0", it must match. For example, when the stored data is [0,X], no matter it is searching for [0,0] or [0,1], [0,X] should match. In the memory cell string 402-$i$, "match" means, in physical, current could pass through. That is, when determining the threshold voltages of the four transistors of the memory cells storing data [0,X], it is necessary to guarantee that the four transistors of the memory cell of [0,X] would all be turned on no matter what is the combination of the search voltage for searching [0,0] or [0,1].

The embodiment of Table 4 is an extension of Table 2. The embodiment of Table 4 supports "wild card" in searching, wherein "?" represents "wild card".

TABLE 4

| S1[Ci1,Ci2] | [T1-i1,T2-i1,T1-i2,T2-i2] | [SL1-1,SL2-1,SL1-2,SL2-2] |
|---|---|---|
| [0,0] | [H,L,L,L] | [V2,V1,V1,V1] |
| [0,1] | [L,H,L,L] | [V1,V2,V1,V1] |
| [1,0] | [L,L,H,L] | [V1,V1,V2,V1] |
| [1,1] | [L,L,L,H] | [V1,V1,V1,V2] |
| [0,?] |  | [V2,V2,V1,V1] |
| [?,0] |  | [V2,V1,V2,V1] |
| [1,?] |  | [V1,V2,V1,V2] |
| [?,1] |  | [V1,V1,V2,V2] |
| [?,?] |  | [V2,V2,V2,V2] |

A brief description of the operating principle of "wild card" is provided herein. "Wild card" represents that no matter the stored data is "1" or "0", it must match. For example, when the data to be searched is [0,?], no matter the stored data is [0,0] or [0,1], [0,?] should match. In the memory cell string 402-$i$, "match" means, in physical, current could pass through. That is, when determining the combination of the four searching voltage for searching [0,?], it is necessary to guarantee that the four transistors of the memory cells which store [0,0] and [0,1] would all be turned on.

Noted that, in practice, more than two memory cells could be arranged as a set based on actual need, and the present invention is not limited.

In the present invention, the transistors included in the memory cells are metal field effect transistors (MOSFET) as an example, but in other embodiments, any storage element that could be used to produce a flash memory could be used. It is applied to, for example, charge trapping devices, SONOS transistors and ferroelectric field effect transistors (FeFET), etc. The current sensing unit is, for example, a current sensing unit.

Noted that any suitable two-dimensional or three-dimensional NAND flash memory structure could be applied to the TCAM of the present invention.

Figure 10:
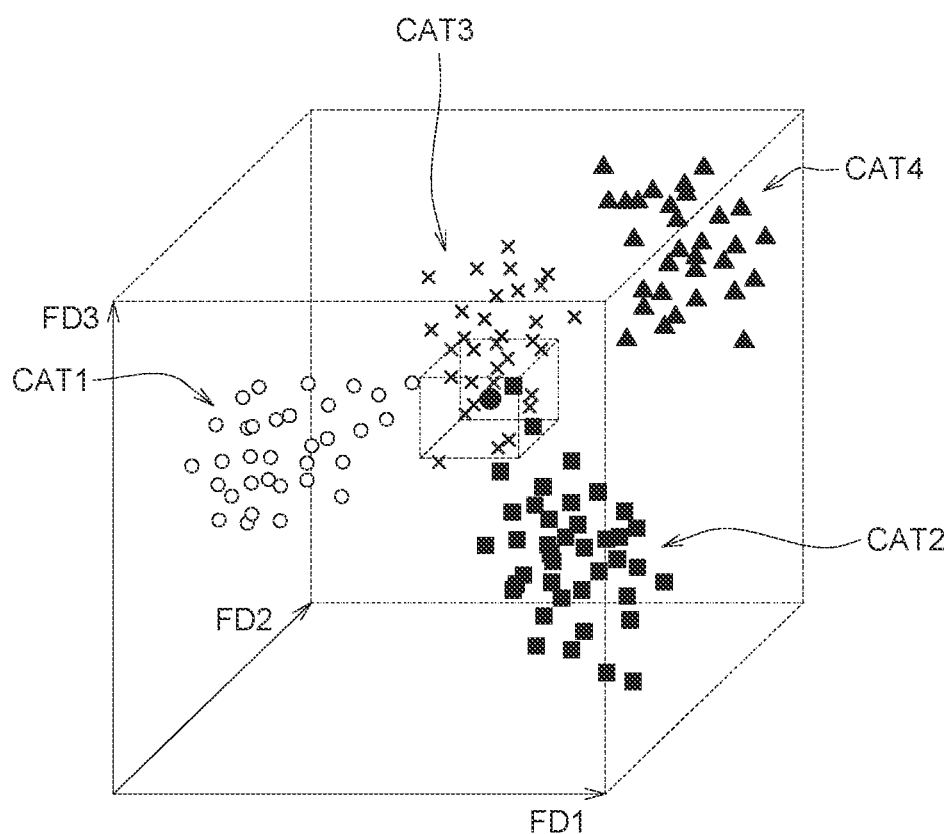
FIG. 10 shows a schematic diagram of data and feature vectors.

In addition to the above described applications, the TCAM provided by the present invention could further be applied to the data searching in a database. Referring to FIG. 10, FIG. 10 shows a schematic diagram of data and feature vectors. In this example, each data could be represented by a feature vector of three-dimension. That is, each data may have three feature values, and these feature values form a feature vector of three-dimension. In FIG. 10, FD1 represents a dimension of a first feature value of the data, FD2 represents a dimension of a second feature value of the data, FD3 represents a dimension of a third feature value of the data, and these three dimension form a vector space of three-dimension. In this vector space, each point represents one data represented by a feature vector of three-dimension. The points of the data belong to the same category are usually clustered in certain area in the vector space. FIG. 10 shows data of four categories CAT1~CAT4 that are clustered in four different areas. In a real case, data in the database could be animal images, including four categories: dog, cat, bird and snake. Each animal image may have three feature values, and is represented by a feature vector of three-dimension. The TCAM provided by the present invention could be used to store these feature vectors of the data. Base on the application, the present invention provides a decision generation method for the TCAM.

Figure 11:
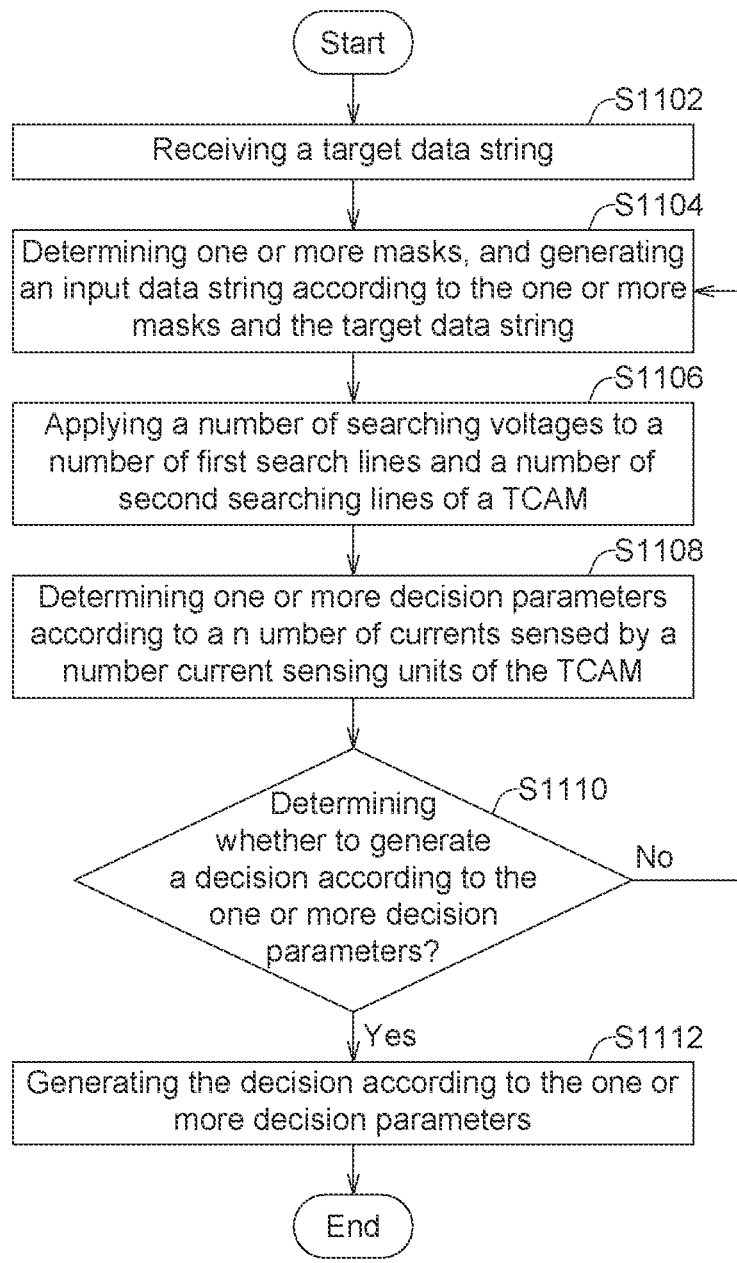
FIG. 11 shows a flow chart of decision generation method according to an embodiment of the present invention.

Referring to FIG. 11, in S1102, a target data string is received. The target data string may include a number of binary bits. For example, a feature vector of an animal image to be identified could be obtained by calculation. The target data string could be obtained by representing the feature vector in binary. Based on different original data, the approach for calculating the feature vector may be different.

In S1104, one or more masks are determined, and an input data string is generated according to the one or more masks and the target data string. As shown in FIG. 12, after the target feature vector is converted to binary, the masked bits are replaced with wild cards "X". The number and position of the masks could be configured arbitrarily (FIG. 12 shows three different mask configurations).

In S1106, a number of searching voltages are applied to a number of first search lines and a number of second search lines of a TCAM according to the input data string. Regarding the correspondence between the searching voltages and "0", "1" and "wild cards", please refer to the foregoing description, which would not be repeated herein.

In S1108, one or more decision parameters are determined according to a number of currents values obtained by a number of current sensing units of the TCAM detecting the first search lines and the second search lines. The one or more decision parameters could be obtained by analyzing the current values sensed by the current sensing units. For example, from the current values sensed by the current sensing units, the number of the matched data strings, the memory addresses of the matched data strings could be obtained. By accessing the memory address of the matched data strings, the content and category of the matched data string could be obtained. The decision parameters may include the number of the matched data strings, the categories of the matched data strings, and the difference between the matched data strings (e.g., Hamming distance).

In S1110, whether to make a decision is determined according to the one or more decision parameters. Whether to make the decision could be determined based on, for example, whether the number of matched data strings is greater than a threshold. The criteria for determining whether to make the decision could be configured based on actual requirements. When it is determined to make the decision, perform S1112; when it is determined not to make the decision, return to S1104 to modify the mask.

In S1112, the decision is generated according to the one or more decision parameters. For example, the final decision could be determined as the category that has the most matched data string. The approach of generating the decision could be configured according to needs, and the present invention is not limited.

In an embodiment, the TCAM may include one In-memory searching (IMS) engine for performing S1104. In another embodiment, the TCAM may include a number of blocks, these blocks may respectively include one IMS engine. That is, a number of target data strings could be received simultaneously in S1102, one or more masks would be configured respectively for different target data strings, search would be made simultaneously or sequentially by multiple IMS engines in S1106, and the decision parameters would be generated by analyzing all searching results in S1106.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A ternary content addressable memory (TCAM), comprising:
   a plurality of first search lines;
   a plurality of second search lines;
   a plurality of memory cell strings, each of the memory cell strings comprising a plurality of memory cells, each of the memory cells coupled to one of the first search lines and one of the second search lines; and
   one or more current sensing units, coupled to the memory cell strings,
   wherein in a search operation, a determination that whether any of the data stored in the memory cell strings matches a data string to be searched is made according to whether the one or more current sensing units detect current from the memory cell strings, or according to the magnitude of the current flowing out from the memory cell strings detected by the one or more current sensing units;
   wherein the plurality of memory cell strings comprise a particular memory cell string, each memory cell of the particular memory cell string comprises a first transistor and a second transistor, a first terminal of the first transistor is coupled to a corresponding first search line, a first terminal of the second transistor is coupled to a corresponding second search line, the first terminal of the first transistor is a gate of the first transistor, and the first terminal of the second transistor is a gate of the second transistor;
   wherein when the data stored in the particular memory cell string matches the data string to be searched in the search operation, a particular current flows through the memory cells of the particular memory cell string and a corresponding current sensing unit detects the particular current outputted from the particular memory cell string, or the corresponding current sensing unit detects a magnitude of the particular current.

2. The TCAM according to claim 1, wherein the memory cell strings are arranged as a plurality groups, each of the groups of the memory cell strings are coupled to the corresponding current sensing unit through a AND gate.

3. The TCAM according to claim 1, wherein a second terminal of the second transistor is coupled to a second terminal of the first transistor, and a third terminal of the second transistor is coupled to a third terminal of the first transistor.

4. The TCAM according to claim 3, wherein, for each of the memory cells, in a programming operation, when programming a first value, a threshold of the first transistor is programmed to a low threshold voltage and a threshold of the second transistor is programmed to a high threshold voltage;
   wherein when programming a second value, the threshold of the first transistor is programmed to the high threshold voltage and the threshold of the second transistor is programmed to the low threshold voltage.

5. The TCAM according to claim 4, wherein, for each of the memory cells, in the search operation, when the first value is searched, the first searching line is applied with a first searching voltage and the second search line is applied with a second search voltage, and when the second value is searched, the first searching line is applied with the second searching voltage and the second search line is applied with the first search voltage, wherein the second searching voltage is higher than the high threshold voltage, the second threshold voltage is higher than the first searching voltage, and the first searching voltage is higher than the low threshold voltage.

6. The TCAM according to claim 4, wherein, for each of the memory cells, in the programming operation, when programming "don't care", the threshold voltages of the first transistor and the second transistor are programmed to the low threshold voltage.

7. The TCAM according to claim 5, wherein, for each of the memory cells, in the search operation, when a "wild card" is searched, the first search line and the second search line are applied with the second searching voltage.

8. The TCAM according to claim 1, wherein each of the memory cells strings comprises a plurality of transistors serially connected, half of the transistors respectively are the first transistors of the memory cells, the other half of the transistors are the second transistors of the memory cells.

9. The TCAM according to claim 8, wherein, for each of the memory cells, in a programming operation, when programming a first value, a threshold of the first transistor is programmed to a low threshold voltage and a threshold of the second transistor is programmed to a high threshold voltage;
   wherein when programming a second value, the threshold of the first transistor is programmed to the high threshold voltage and the threshold of the second transistor is programmed to the low threshold voltage.

10. The TCAM according to claim 9, wherein, for each of the memory cells, in the search operation, when the first value is searched, the first searching line is applied with a first searching voltage and the second search line is applied with a second search voltage, and when the second value is searched, the first searching line is applied with the second searching voltage and the second search line is applied with the first search voltage, wherein the second searching voltage is higher than the high threshold voltage, the second threshold voltage is higher than the first searching voltage, and the first searching voltage is higher than the low threshold voltage.

11. The TCAM according to claim 9, wherein, for each of the memory cells, in the programming operation, when programming "don't care", the threshold voltages of the first transistor and the second transistor are programmed to the low threshold voltage.

12. The TCAM according to claim 10, wherein, for each of the memory cells, in the search operation, when a "wild card" is searched, the first search line and the second search line are applied with the second searching voltage.

13. The TCAM according to claim 8, wherein, for each of the memory cell strings, the memory cells are arranged as a plurality of sets, each of the sets comprises two or more memory cells, for each set of the memory cells, in a programming operation, when programming data without "don't care", a threshold voltage of one of the transistors of the memory cells is programmed to a secondary state, threshold voltages of the other transistors of the memory cells are programmed to a primary state, wherein the primary state is one of a high threshold voltage and a low threshold voltage, and the secondary state is the other of the high threshold voltage and the low threshold voltage.

14. The TCAM according to claim 8, wherein the first transistors and the second transistors are alternatively arranged and are serially connected.

15. The TCAM according to claim 14, wherein a third terminal of the first transistor of a particular memory cell is coupled to a second terminal of the second transistor of the particular memory cell.

16. The TCAM according to claim 8, wherein the first transistors of the particular memory cell string are arranged to be connected together to form a first transistor string, the second transistors of the particular memory cell string are arranged to be connected together to form a second transistor string, and the first transistor string and the second transistor string are connected serially.

17. The TCAM according to claim 8, wherein the first transistors of the particular memory cell string are connected in series as a first transistor string, and the second transistors of the particular memory cell string are connected in series as a second transistor string, the first transistor string and the second transistor string are coupled to a AND gate.

18. The TCAM according to claim 1, wherein the memory cells of the particular memory cell string are serially connected.

19. A decision generation method for TCAM, comprising:
receiving a target data string;
determining one or more masks, and generating an input data string according to the one or more masks and the target data string;
applying a plurality of searching voltages to a plurality of first search lines and a plurality of second search lines according to the input data string;
generating one or more decision parameters according to a plurality of current values sensed by a plurality of current sensing units; and
generated a decision according to the one or more decision parameters;
wherein the first search lines and the second search lines are coupled to a plurality of memory cell strings, the plurality of memory cell strings comprise a particular memory cell string, the particular memory cell string comprises a plurality of memory cells, each memory cell of the particular memory cell string comprises a first transistor and a second transistor, a first terminal of the first transistor is coupled to a corresponding first search line, a first terminal of the second transistor is coupled to a corresponding second search line, the first terminal of the first transistor is a gate of the first transistor, and the first terminal of the second transistor is a gate of the second transistor;
wherein when the data stored in the particular memory cell strings matches the data string to be searched in the search operation, a particular current flows through the memory cells of the particular memory cell string and a corresponding current sensing unit detects the particular current outputted from the particular memory cell string, or the corresponding current sensing unit detects a magnitude of the particular current.

20. The decision generation method according to claim 19, further comprising:
determining whether to make the decision according to the one or more decision parameters.

* * * * *